United States Patent
Ushiroda

(10) Patent No.: US 6,281,065 B1
(45) Date of Patent: Aug. 28, 2001

(54) SEMICONDUCTOR DEVICE FABRICATION METHOD

(75) Inventor: Masaru Ushiroda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/460,857

(22) Filed: Dec. 14, 1999

(30) Foreign Application Priority Data

Dec. 15, 1998 (JP) .................................................. 10-356437

(51) Int. Cl.$^7$ .............................................. H01L 21/8249
(52) U.S. Cl. ............................................. 438/234; 438/202
(58) Field of Search ................................... 438/225, 234, 438/266, 197, 202, 205, 204, 235, 236

(56) References Cited

U.S. PATENT DOCUMENTS

| | | | | |
|---|---|---|---|---|
| 4,407,059 | * | 10/1983 | Sasaki | 29/571 |
| 4,921,811 | * | 5/1990 | Watanabe et al. | 438/207 |
| 5,028,557 | * | 7/1991 | Tsai et al. | 438/202 |
| 5,079,183 | * | 1/1992 | Maeda et al. | 438/219 |

FOREIGN PATENT DOCUMENTS

| | | |
|---|---|---|
| 3-198371 | 8/1991 | (JP) . |
| 8-8351 | 1/1996 | (JP) . |
| 9-69580 | 3/1997 | (JP) . |

* cited by examiner

Primary Examiner—David Nelms
Assistant Examiner—David Nhu
(74) Attorney, Agent, or Firm—McGinn & Gibb, PLLC

(57) ABSTRACT

In order to define region in which a bipolar transistor is formed, region in which a MOS transistor is formed, and another predetermined region upon a substrate of p-type silicon, the substrate is selectively oxidized (by the LOCOS method). An element isolation region 200–500 nm thick is thereby formed. Then, a silicon oxide film 550 nm thick on the substrate, a silicon nitride film (an oxidation-resistant film) 100–300 nm thick, and a silicon oxide film 5–50 nm thick are formed. Thereafter, a publicly known photolithographic technique is used to form a photoresist pattern having an opening, and then, using the pattern as a mask, the silicon oxide film on the opening is removed. The bipolar transistor and the MOS transistor are thereby integrated in a monolithic manner without degrading the characteristics of the respective elements.

11 Claims, 9 Drawing Sheets

SEMICONDUCTOR DEVICE FABRICATION METHOD

BACKGROUND OF THE INVENTION

1. Field of the Invention

The present invention relates to a method for fabricating a semiconductor device in which a bipolar transistor and a MOS transistor are integrated on the same substrate.

2. Related Art

MOS transistors have many advantages but, on the other hand, have disadvantages such as low mutual conductance, a limited switching speed when used as an element of the integrated circuit for driving capacitive load, and limited performance as a power semiconductor device. The advantages and disadvantages of bipolar transistors are opposite to those of MOS transistors. For providing the advantages of the both, composite elements in which a bipolar transistor and a MOS transistor are integrated in a monolithic manner have been used.

A semiconductor device comprising those composite elements aims at high-speed operation of the device. For this purpose, a thick insulating film is formed under the emitter electrode in order to decrease the parasitic capacitance of the bipolar transistor and, for the MOS transistor, a thin gate insulating film is formed to provide improved performance.

For this reason, the MOS transistor having a gate insulating film typically 10 nm or less in thickness is formed, and thereafter an insulating film as thick as 50 to 200 nm is formed to integrate the bipolar transistor.

Incidentally, in the case where the gate of the MOS transistor to be formed is, for example, approximately 0.3 μm or less in length, heat treatment needs to be reduced in order to prevent diffusion of the dopant of which the source/drain is composed. On the contrary, the bipolar transistor to be formed following the MOS transistor is designed to obtain a desired current amplification factor by allowing the dopant to diffuse to a predetermined region and thus forming the emitter.

Therefore, forming the MOS transistor first would cause the performance of the bipolar transistor to be degraded because the bipolar transistor could not be formed by performing heat treatment at high temperatures for a long duration in order to ensure the characteristics of the MOS transistor. On the other hand, heat treatment performed at high temperatures for a long duration in order to ensure the performance of the bipolar transistor would degrade the performance of the MOS transistor.

SUMMARY OF THE INVENTION

An object of the present invention is to provide a semiconductor device fabrication method that enables a bipolar transistor and a MOS transistor to be integrated in a monolithic manner without degrading the characteristics of the respective elements.

The semiconductor device fabrication method according to the present invention comprises the steps shown below. Initially, first and second regions defined by an element isolation region are formed on a semiconductor substrate. Then, an oxidation-resistant film is so formed on the semiconductor substrate as to allow the first region of the semiconductor substrate to be exposed. Then, a collector layer is formed on the first region. Thereafter, a silicon oxide film is selectively formed on the first region using the oxidation-resistant film as a mask. Subsequently, a base layer is formed on the first region. Then, an emitter layer disposed in the base layer region is formed. Thereafter, formed is an emitter electrode connected to the emitter layer via a contact hole formed through the silicon oxide film. Subsequently, the oxidation-resistant film is removed after a bipolar transistor comprising the collector layer, base layer, and emitter layer has been formed. Then, after the aforementioned steps have been completed, a MOS transistor is formed in the second region.

That is, the bipolar transistor is first formed with the region, where the MOS transistor is to be formed, being protected by means of an oxidation-resistant film. In addition, the regions other than the emitter contact of the emitter electrode are isolated from the surface of the semiconductor substrate by means of the silicon oxide film.

Furthermore, the oxidation-resistant film is formed of silicon nitride and formed on the semiconductor substrate via a silicon oxide film. This allows the silicon oxide film to protect the surface of the semiconductor substrate when the oxidation-resistant film is removed if such etching condition is employed as to selectively remove silicon nitride relative to silicon oxide.

Furthermore, a passivation film is so formed as to cover exposed regions on sides of and an upper surface of the emitter electrode, whereby the emitter electrode is so formed as to be electrically isolated from the surrounding.

Still furthermore, the emitter electrode is formed of polysilicon, and the passivation film is formed by thermally oxidizing the exposed surfaces of the emitter electrode. Consequently, the passivation film is formed in a self-aligning manner without depositing a new film.

DETAILED DESCRIPTION OF THE PREFERRED EMBODIMENTS

The preferred embodiments of the present invention will be explained specifically with reference to the accompanying drawings.

FIGS. 1 through 13 are cross-sectional views depicting a method for fabricating a semiconductor device according to a first embodiment of the present invention in the order of the processes involved.

Figure 1:
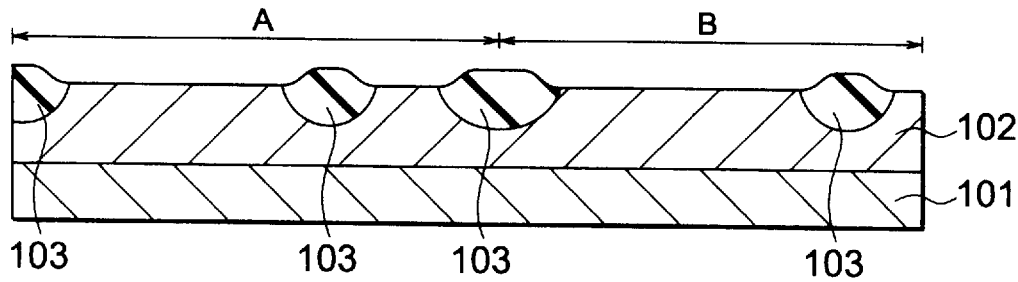
FIGS. 1 through 13 are cross-sectional views depicting a method for fabricating a semiconductor device according to a first embodiment of the present invention in the order of the processes involved.

First, as shown in FIG. 1, an n-type dopant is introduced by ion implantation into a substrate 101 of p-type silicon to form an n quasi-epitaxial layer 102. Moreover, the substrate 101 (the quasi-epitaxial layer 102) is selectively oxidized (by the LOCOS method) so that region A in which a bipolar transistor is formed, region B in which a MOS transistor is formed, and another predetermined region are defined, respectively. Thus, an element isolation region 103 is formed in thickness ranging from 200 to 500 nm. Incidentally, a p-channel MOS transistor is indicated in region B hereinafter, and an n-channel MOS transistor constituting, for example, a CMOS will be omitted.

Figure 2:
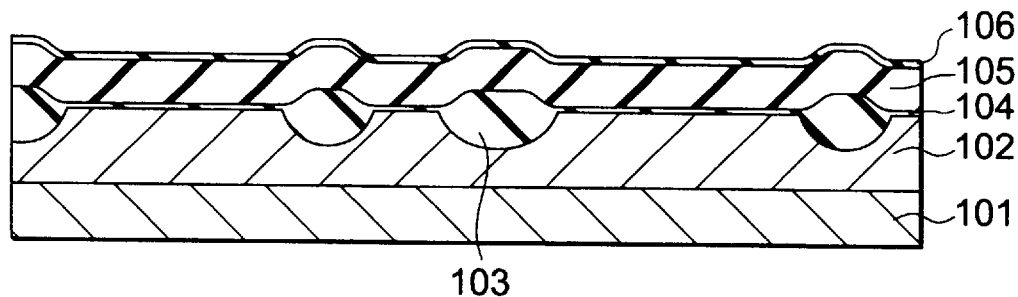

Next, as shown in FIG. 2, on the substrate 101, formed are a silicon oxide film 104 of 5–50 nm in thickness, a silicon nitride film 105 (an oxidation-resistant film) of 100–300 nm in thickness, and a silicon oxide film 106 of 550 nm in thickness.

Figure 3:
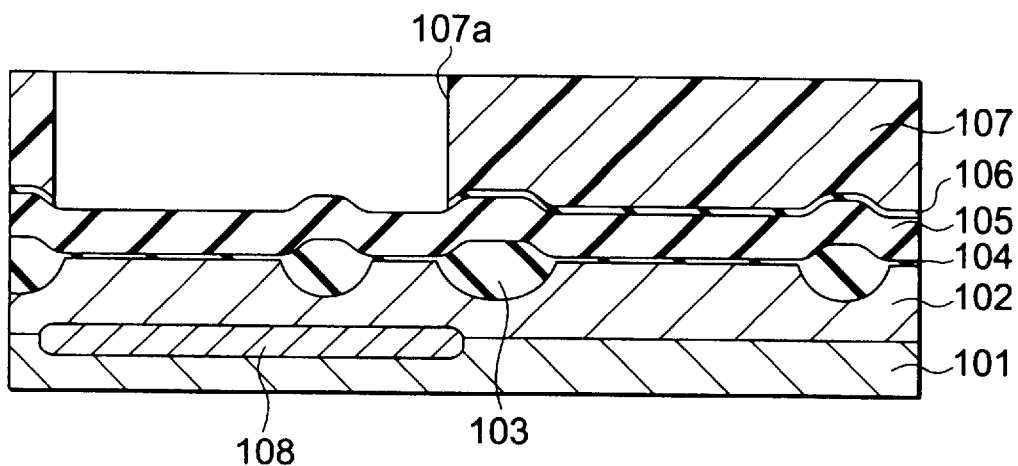

Next, as shown in FIG. 3, a photoresist pattern 107 having an opening 107a is formed using a publicly known photolithographic technique. Then, the silicon oxide film 106 in the opening 107a is stripped away using the same as a mask. In addition, n-type dopant ions are implanted into the opening 107a with an energy ranging from 500 to 1500 keV to yield a dose ranging from $5 \times 10^{12}$ to $5 \times 10^{14}$ cm$^{-2}$ to form an n-type buried layer 108 to a desired depth in the substrate 101 under the opening 107a. The n-type buried layer 108 may be formed by ion implantation before the silicon oxide film 106 is stripped away.

Figure 4:
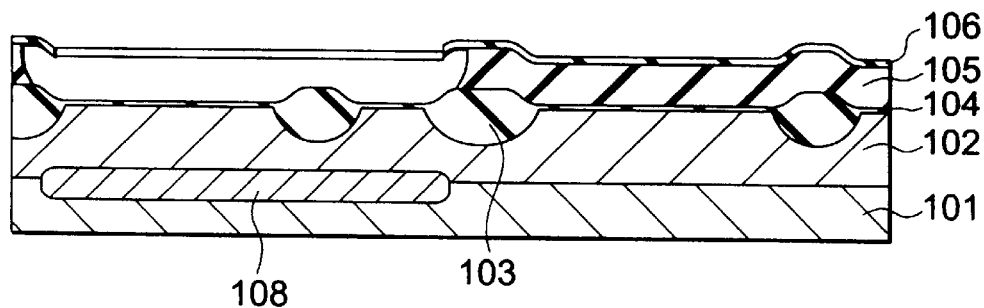

Next, after the photoresist pattern 107 has been stripped away, heat treatment is performed to recover damages caused by the ion implantation. Then, as shown in FIG. 4, the silicon nitride film 105 is etched partially and stripped away using the silicon oxide film 106 as a mask. The wet etching method may be employed, for example, using thermal phosphoric acid for the etching. The wet etching causes the remaining silicon nitride film 105 to have end portions with the cross-sectional profile of a forward taper increasing in width toward the bottom thereof.

Figure 5:
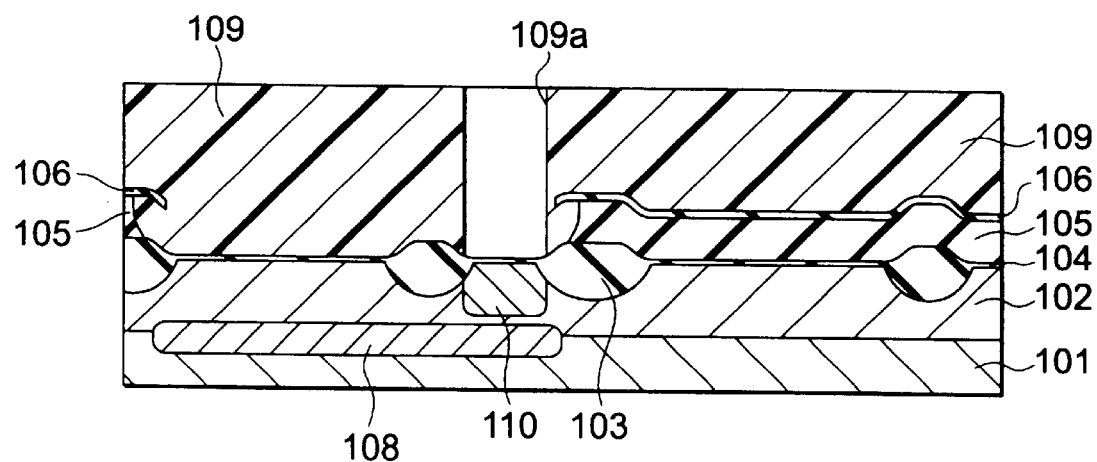

Next, as shown in FIG. 5, a photoresist pattern 109 having an opening 109a is formed on a predetermined region, and an n-type dopant is ion-implanted using the same as a mask to yield a dose ranging from $1 \times 10^{15}$ to $1 \times 10^{16}$ cm$^{-2}$ in order to form a collector layer 110, that is, an n$^+$ diffusion layer.

Next, after the photoresist pattern 109 has been stripped away, the silicon oxide film 106 is selectively stripped away by the wet etching method.

Figure 6:
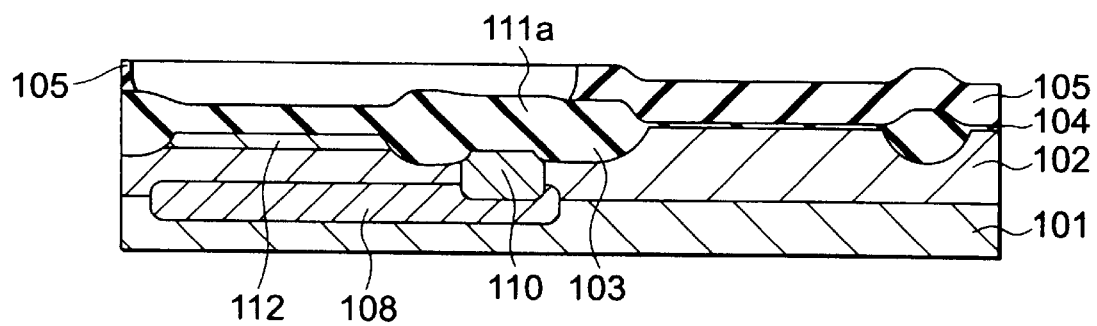

Thereafter, as shown in FIG. 6, a silicon oxide film 111 is formed in thickness ranging from 50 to 150 nm by means of the thermal oxidation method. At this time, the collector layer 110 has an n-type dopant introduced and thus has a faster speed of oxidation (fast oxidation) compared with that of other regions, and a thick silicon oxide film 111a ranging from 100 to 500 nm in thickness is formed. Moreover, the region B for forming a MOS transistor, which is covered with the silicon nitride film 105, is not oxidized due to the oxidation-resistant property of the silicon nitride. Additionally, the heating causes the region of the n-type buried layer 108 to be expanded and brought into contact with the collector layer 110.

Furthermore, a p-type dopant is ion-implanted with an energy ranging from 10 to 80 keV to yield a dose on the order of $5 \times 10^{12}$ to $5 \times 10^{14}$ cm$^{-2}$, thereby forming a base layer 112, that is, a p-type diffusion layer, on a region under the silicon oxide film 111 on the n-type buried layer 108. In the regions other than the silicon oxide film 111, there exist the element isolation region 103, the silicon oxide film 111a that has been formed thick by fast oxidation, and the silicon nitride film 105. Therefore, the ion implantation allows no dopant to be introduced into the regions of silicon thereunder. That is, the base layer 112 can be formed only immediately under the silicon oxide film 111 in a self-aligning manner without using photoresist patterns.

Figure 7:
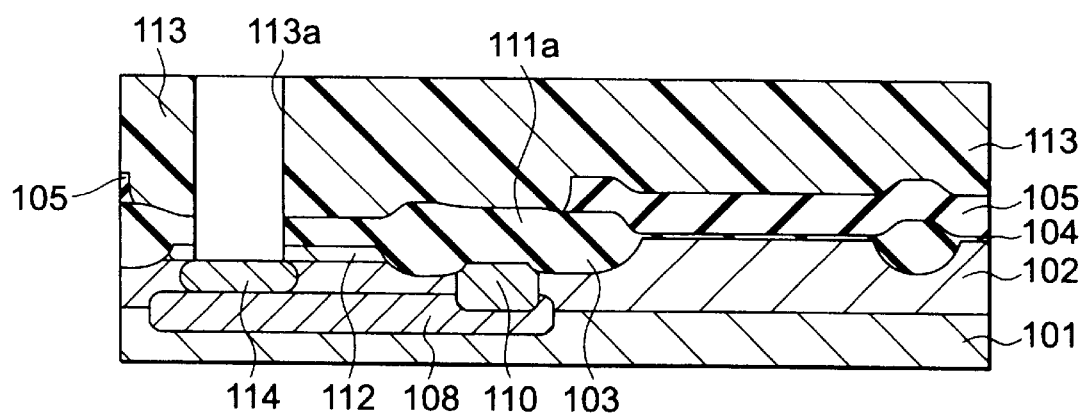

Next, as shown in FIG. 7, a photoresist pattern 113 having an opening 113a is formed, and the silicon oxide film 111 is selectively etched and stripped away using the same as a mask. Then, using the photoresist pattern 113 as a mask, an n-type dopant is ion-implanted this time, thereby forming an n-type diffusion layer 114, which serves to provide improved bipolar transistor performance, in contact with the n-type buried layer 108. This may be accomplished by ion implantation of an n-type dopant, for example, with an energy ranging from 100 to 1000 kev to yield a dose on the order of $5 \times 10^{11}$ to $5 \times 10^{13}$ cm$^{-2}$.

Figure 8:
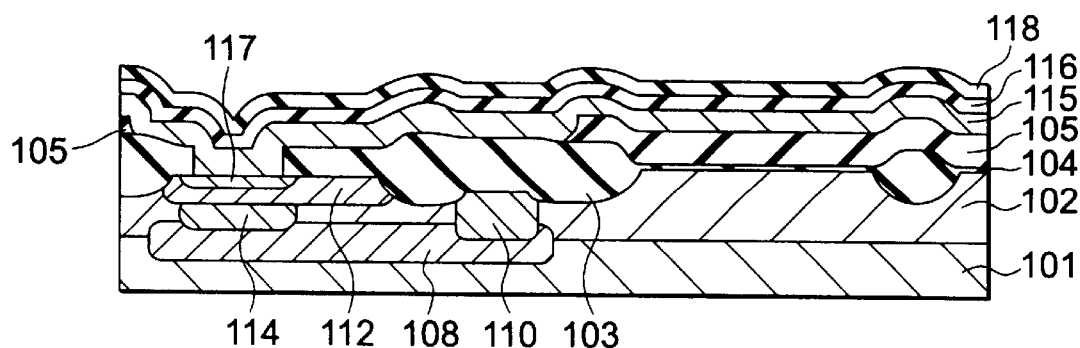

Next, after the photoresist pattern 113 has been stripped away, a polysilicon film 115 is formed in a film thickness ranging from 100 to 300 nm as shown in FIG. 8. In addition, an n-type dopant is ion-implanted into the polysilicon film 115 to yield a dose on the order of $1 \times 10^{15}$ to $1 \times 10^{16}$ cm$^{-2}$.

Subsequently, a silicon oxide film 116 of a thickness ranging from 50 to 200 nm is formed on the polysilicon film 115 and then heat treatment is performed under this condition. This causes the dopant introduced in the polysilicon film 115 to diffuse toward the substrate 101, thereby forming an emitter layer 117 comprising an n$^+$ diffusion region in the base layer 112. Then, a silicon nitride film 118 is formed thereon in a film thickness of approximately 10 to 100 nm.

Figure 9:
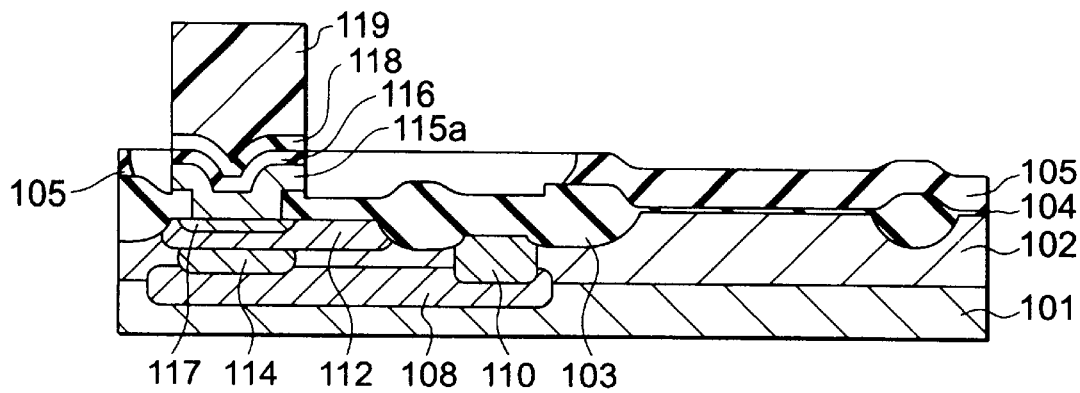

Next, as shown in FIG. 9, a photoresist pattern 119 is so formed as to cover the region over the emitter layer 117. Using the same as a mask, the silicon nitride film 118, the silicon oxide film 116, and the polysilicon film 115 are patterned by etching. This patterning allows for forming an emitter electrode 115a that is electrically conductive and formed of polysilicon. The reactive ion etching (RIE) method may be used for this etching. In this process, since the end portions of the silicon nitride film 105 have a forward taper, no polysilicon film 115 remains on the end portions of the silicon nitride film 105 even by means of such etching that has vertical anisotropy.

Figure 10:
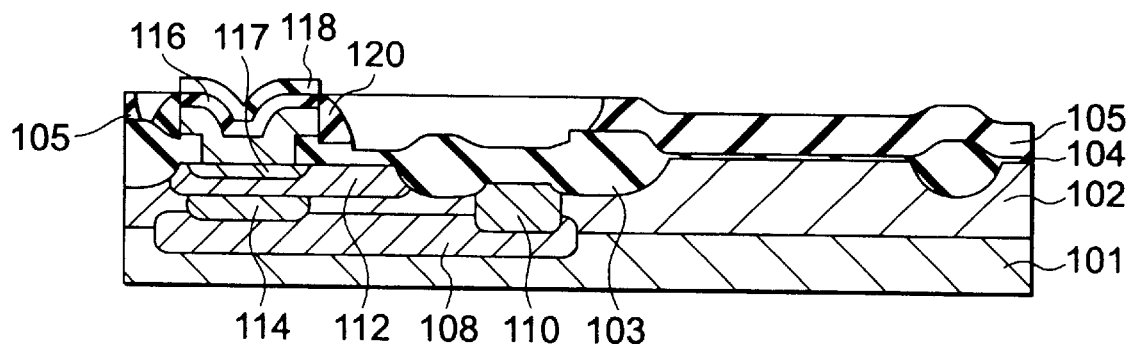

Next, after the photoresist pattern 119 has been stripped away, a silicon oxide film of a film thickness of approximately 50 to 300 nm is formed on all regions. The film is etched back by the reactive ion etching method or the like, thereby a side wall 120 is formed on the side of the emitter electrode 115a and the patterned silicon oxide film 116, as shown in FIG. 10. Consequently, the emitter electrode 115a is brought into a state of being covered with a passivation film comprising the silicon oxide film 116 and the side wall 120. As such, covering with the passivation film prevents the dopant from diffusing outwardly from the emitter electrode 115a in subsequent heating processes.

Figure 11:
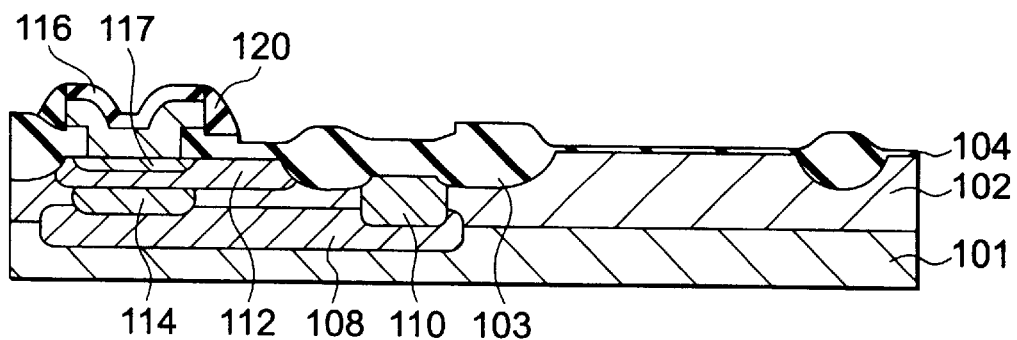

Next, as shown in FIG. 11, the silicon nitride film 105 and the silicon nitride film 118 are selectively stripped away by the wet etching method. Through the aforementioned processes, main portions of the bipolar transistor have been formed before a MOS transistor is formed.

Figure 12:
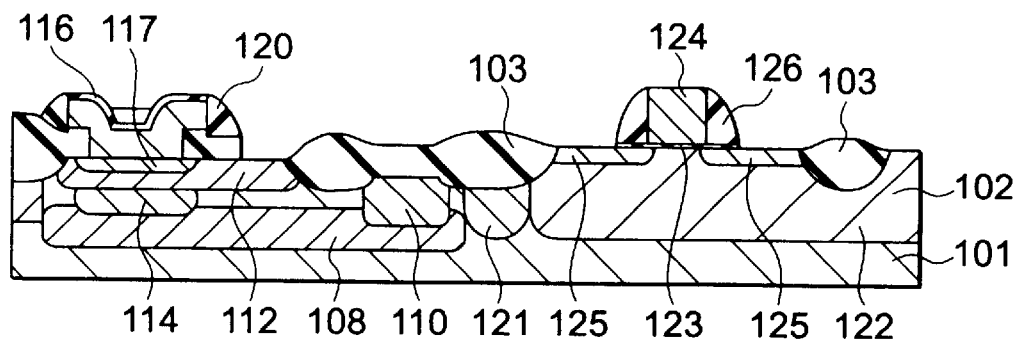

Subsequently, as shown in FIG. 12, ions are selectively implanted into the element isolation region 103 located on the boundary between the bipolar transistor region and the region where the MOS transistor is to be formed, thereby forming a p well 121. This may be formed at the same time the p-well region of an n-channel transistor (not shown) is formed. Moreover, ion implantation is also selectively performed, thereby forming an n well 122 in the region where a p-channel MOS transistor is to be formed. Then, the silicon oxide film 104 is stripped away, and a gate insulating film 123 and a gate electrode 124 are formed. In addition, a p-type dopant is ion-implanted using the gate electrode 124 as a mask, thereby forming a low-concentration region 125 on the substrate 101 in a self-aligning manner. The low-concentration region 125 is used to constitute an LDD structure and may be omitted depending on the transistor performance required. Alternatively, a counter-doped n$^-$ diffusion layer may be employed for this purpose.

Next, etching is performed by the RIE method after a silicon oxide film has been formed on the entire surface, thereby forming a side wall 126 on the side of the gate electrode 124. Thereafter, over-etching is subsequently performed to allow the surface of the substrate 101 of the diffusion layer portion of the MOS transistor to be exposed.

At the same time, the surface of the substrate 101 (the base surface) where a side of the base layer 112 of the emitter electrode 115a is formed is exposed.

Figure 13:
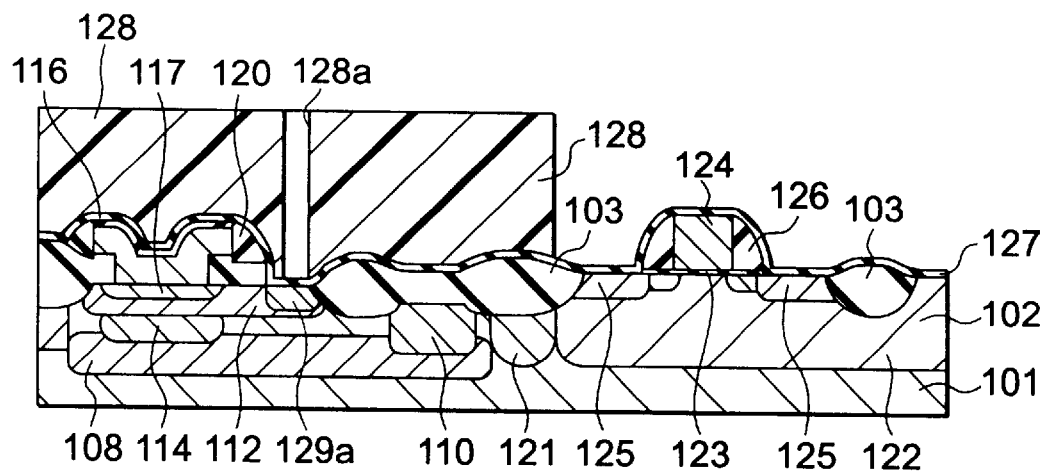

Next, as shown in FIG. 13, after a silicon oxide film 127 has been formed on the entire regions, a photoresist pattern 128 having an opening 128a is formed on a region of the aforementioned base surface. Then, using this as a mask, a p-type dopant is ion-implanted to yield a dose on the order of $1 \times 10^{15}$ to $1 \times 10^{16}$ cm$^{-2}$, thereby forming a graft base 129a of the bipolar transistor as well as a source/drain 125.

Subsequently, after an interlayer film has been formed using an insulating material, processing is carried out according to a well-known semiconductor device formation method to complete a semiconductor device comprising composite elements. For example, contact holes are formed to provide contacts for the source/drain or other portions, circuits are patterned, and passivation films are formed.

As explained above, according to this embodiment 1, thermal oxidation is performed using the silicon nitride film 105, which has an opening only on a bipolar transistor forming region, as a mask, thereby allowing an oxide film to be formed only upon the bipolar transistor forming region. That is, the silicon oxide film 111 under the emitter electrode 115a can be formed in a desired thickness.

Moreover, a thick silicon oxide film can be simultaneously formed upon the collector layer 110 taking advantage of faster oxidation of the collector layer 110. Taking advantage of this, the base layer 112 can be formed in a self-aligning manner.

Furthermore, the silicon nitride film 105 is not stripped away until the main portions of the bipolar transistor are completed, so that the element isolation region 103 in the MOS transistor region can be prevented from being reduced in thickness due to the etching during forming the bipolar transistor.

Still furthermore, the MOS transistor is formed after the bipolar transistor has been formed, so that the MOS transistor can be formed without being affected by the heat treatment carried out for forming the bipolar transistor.

Figure 14:
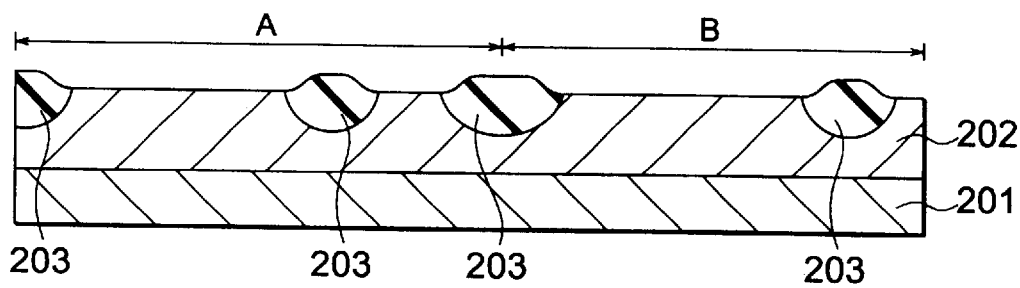
FIGS. 14 through 25 are cross-sectional views depicting a method for fabricating a semiconductor device according to a second embodiment of the present invention in the order of the processes involved.

Now, a second embodiment of the present invention will be explained. FIGS. 14 through 25 are cross-sectional views depicting a method according to the second embodiment of the present invention in the order of the processes involved. First, as shown in FIG. 14, an n-type dopant is introduced by ion implantation into a substrate 201 of p-type silicon to form an n$^-$ quasi-epitaxial layer 202. Moreover, the substrate 201 is selectively oxidized so that region A in which a bipolar transistor is formed, region B in which a MOS transistor is formed, and another predetermined region are defined, respectively. Thus, an element isolation region 203 is formed in thickness ranging from 200 to 500 nm. Incidentally, also in this embodiment 2, a p-channel MOS transistor is indicated in region B hereinafter, and an n-channel MOS transistor constituting, for example, a CMOS will be omitted.

Figure 15:
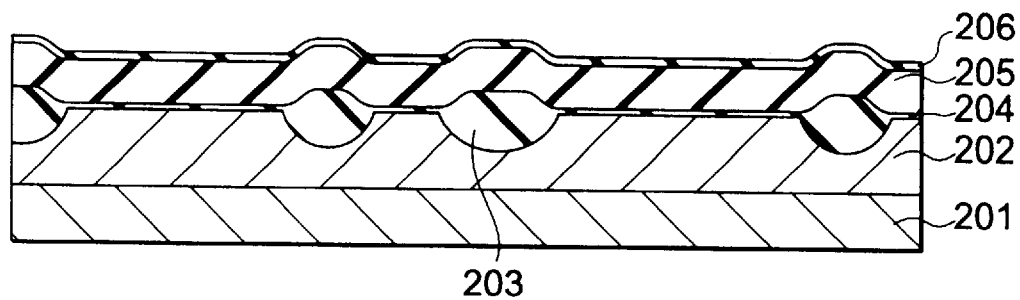

Next, as shown in FIG. 15, on the substrate 201, formed are a silicon oxide film 204 of 5–50 nm in thickness, a silicon nitride film 205 of 100–300 nm in thickness, and a silicon oxide film 206 of 5–50 nm in thickness.

Figure 16:
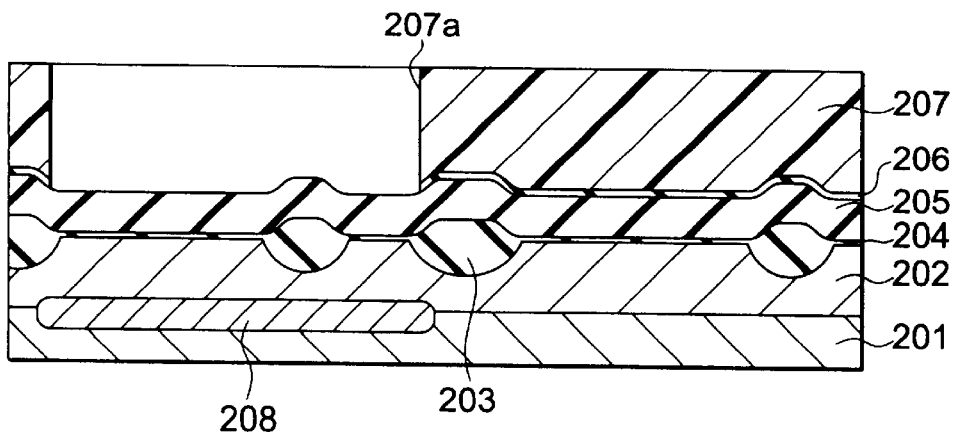

Next, as shown in FIG. 16, a photoresist pattern 207 having an opening 207a is formed using a publicly known photolithographic technique. Then, the silicon oxide film 206 in the opening 207a is stripped away using the same as a mask. In addition, n-type dopant ions are implanted into the opening 207a with an energy ranging from 500 to 1500 keV to yield a dose ranging from $5 \times 10^{12}$ to $5 \times 10^{14}$ cm$^{-2}$ to form an n-type buried layer 208 to a desired depth in the substrate 201 under the opening 207a. The n-type buried layer 208 may be formed by ion implantation before the silicon oxide film 206 is stripped away.

Figure 17:
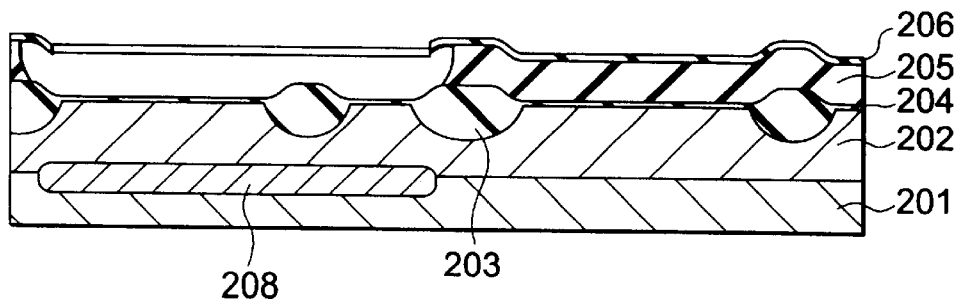

Next, after the photoresist pattern 207 has been stripped away, heat treatment is performed to recover damages caused by the ion implantation. Then, as shown in FIG. 17, the silicon nitride film 205 is etched partially and stripped away using the silicon oxide film 206 as a mask. The wet etching method may be employed, for example, using thermal phosphoric acid for the etching. The wet etching causes the remaining silicon nitride film 205 to have end portions with the cross-sectional profile of a forward taper increasing in width toward the bottom thereof.

Figure 18:
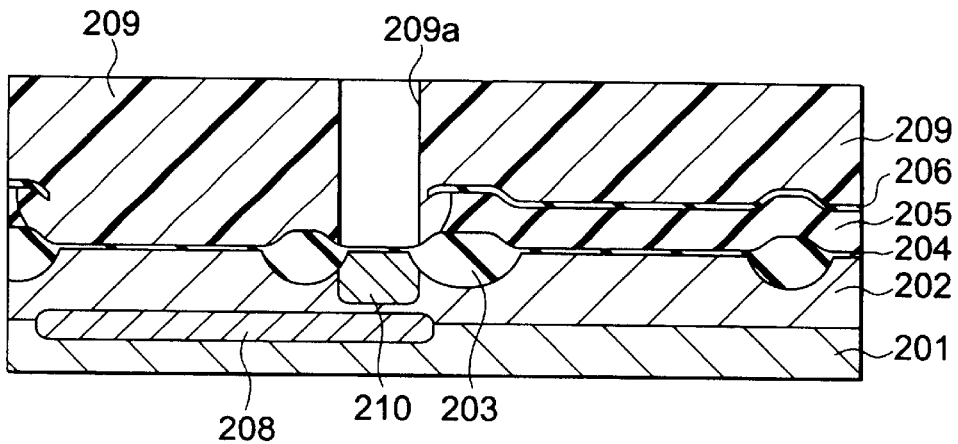

Next, as shown in FIG. 18, a photoresist pattern 209 having an opening 209a is formed on a predetermined region, and an n-type dopant is ion-implanted using the same as a mask to yield a dose ranging from $1 \times 10^{15}$ to $1 \times 10^{16}$ cm$^{-2}$ in order to form a collector layer 210, that is, an n$^+$ diffusion layer.

Next, after the photoresist pattern 209 has been stripped away, the silicon oxide film 206 is selectively stripped away by the wet etching method.

Figure 19:
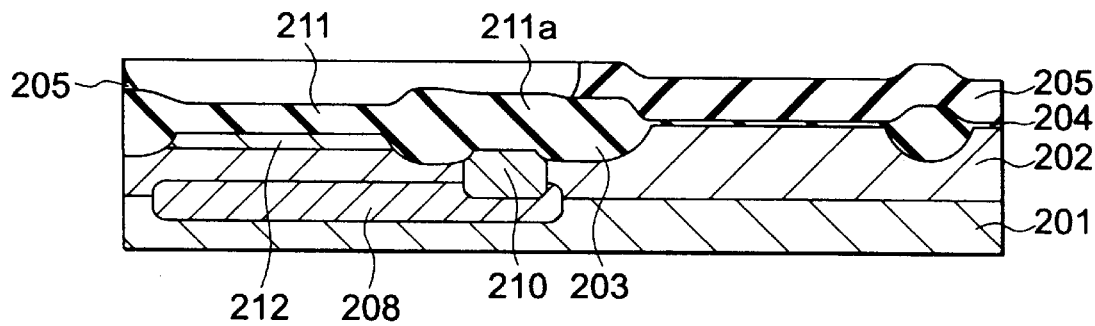

Thereafter, as shown in FIG. 19, a silicon oxide film 211 is formed in a thickness ranging from 50 to 150 nm by means of the thermal oxidation method. At this time, the collector layer 210 has an n-type dopant introduced and thus has a faster speed of oxidation compared with that of other regions, and a thick silicon oxide film 211a ranging from 100 to 500 nm in thickness is formed. Moreover, the region for forming a MOS transistor, which is covered with the silicon nitride film 205, is not oxidized due to the acid-resistant property of the silicon nitride. Additionally, the heating causes the region of the n-type buried layer 208 to be expanded and brought into contact with the collector layer 210.

Furthermore, a p-type dopant is ion-implanted with an energy ranging from 10 to 80 keV to yield a dose on the order of $5 \times 10^{12}$ to $5 \times 10^{14}$ cm$^{-2}$, thereby forming a base layer 212, that is, a p-type diffusion layer, on a region under the silicon oxide film 211 on the n-type buried layer 208. In the regions other than the silicon oxide film 211, there exist the element isolation region 203, the silicon oxide film 211a that has been formed thick by fast oxidation, and the silicon nitride film 205. Therefore, the ion implantation allows no dopant to be introduced into the regions of silicon thereunder. That is, the base layer 212 can be formed only immediately under the silicon oxide film 211 in a self-aligning manner without using photoresist patterns.

Figure 20:
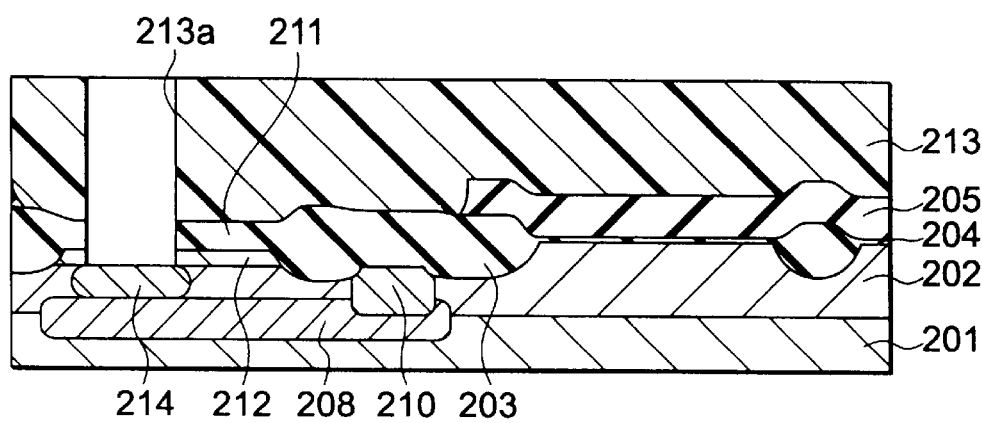

Next, as shown in FIG. 20, a photoresist pattern 213 having an opening 213a is formed, and the silicon oxide film 211 is selectively etched and stripped away using the same as a mask. Then, using the photoresist pattern 213 as a mask, an n-type dopant is ion-implanted this time, thereby forming an n-type diffusion layer 214, which serves to provide improved bipolar transistor performance, in contact with the n-type buried layer 208. This may be accomplished by ion implantation of an n-type dopant, for example, with an energy ranging from 100 to 1000 keV to yield a dose on the order of $5 \times 10^{11}$ to $5 \times 10^{13}$ cm$^{-2}$.

The foregoing is roughly the same as the aforementioned first embodiment.

Moreover, in this second embodiment, an emitter electrode is formed as shown below.

Figure 21:
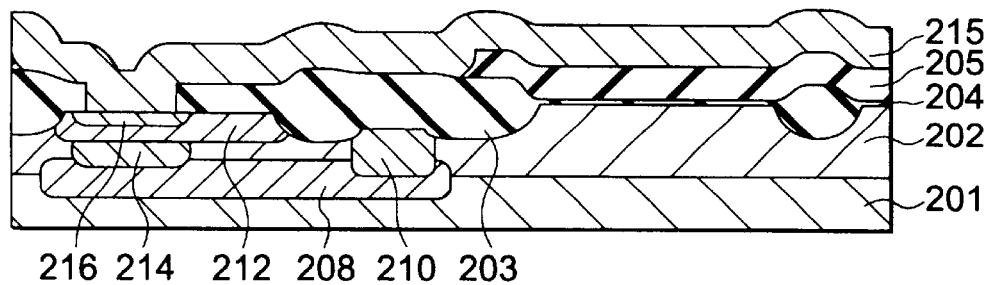

First, after the photoresist pattern 213 has been stripped away, a polysilicon film 215 is formed in a thickness ranging from 150 to 500 nm as shown in FIG. 21. In addition, an n-type dopant is ion-implanted into the polysilicon film 215 to yield a dose on the order of $1\times10^{15}$ to $5\times10^{16}$ cm$^{-2}$. Heat treatment is performed subsequently, thereby causing the dopant introduced in the polysilicon film 215 to diffuse into the silicon substrate 201 and forming an emitter layer 216 comprising an n$^+$ diffusion region in the base layer 212.

Figure 22:
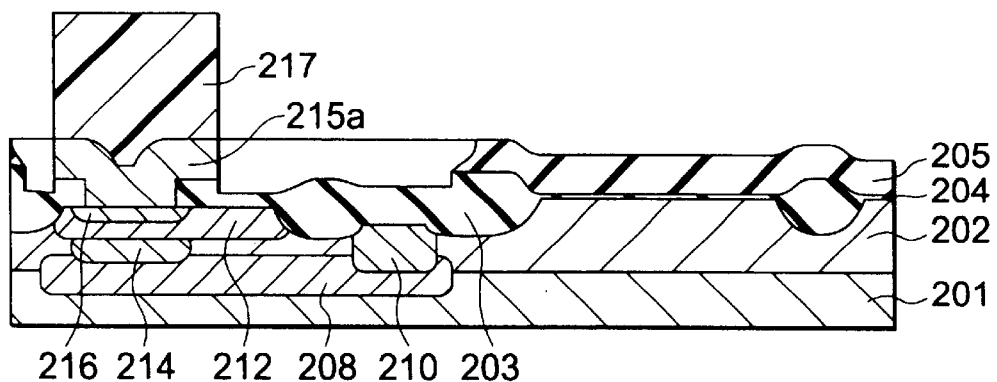

Next, as shown in FIG. 22, a photoresist pattern 217 is so formed as to cover the region over the emitter layer 216. Using the same as a mask, the polysilicon film 215 is patterned by etching. This patterning allows for forming an emitter electrode 215a that is electrically conductive and formed of polysilicon. The reactive ion etching method may be used for this etching. In this process, since the end portions of the silicon nitride film 205 have a forward taper, no polysilicon film 215 remains on the end portions of the silicon nitride film 205 even by means of such etching that has vertical anisotropy.

Figure 23:
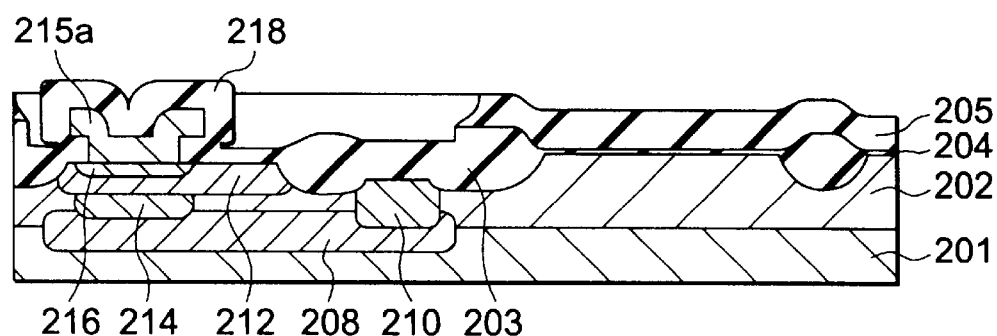

Next, after the photoresist pattern 217 has been stripped away, the exposed faces such as the sides of and the upper surface of the emitter electrode 215a are treated by thermal oxidation. As shown in FIG. 23, this is performed so that the emitter electrode 215a is brought into a state of being covered with a silicon oxide film 218. Covering with the passivation film as such prevents the dopant from diffusing outwardly from the emitter electrode 215a in subsequent heating processes. Furthermore, in this embodiment 2, an oxide film is formed by thermal oxidation, thereby electrically isolating the emitter electrode 215a from the surrounding. This simplifies the fabrication process compared with that of the aforementioned embodiment 1. Incidentally, the polysilicon film 215 for forming the emitter electrode 215a is made thick corresponding to the amount of being oxidized (the silicon oxide film 218).

Figure 24:
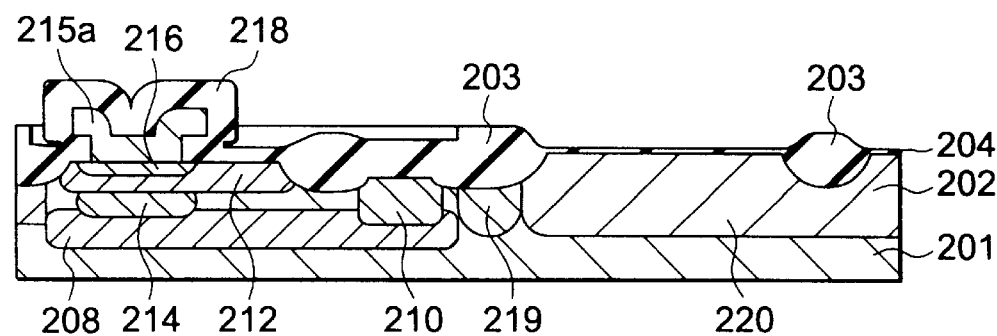

Next, as shown in FIG. 24, the silicon nitride film 205 is selectively stripped away by the wet etching method. Through the aforementioned processes, main portions of the bipolar transistor have been formed before a MOS transistor is formed.

Subsequently, like the aforementioned embodiment 1, ions are first selectively implanted into the element isolation region 203 located on the boundary between the bipolar transistor region and the region where the MOS transistor is to be formed, thereby forming a p well 219. The p well 219 may be formed at the same time a p-well region of an n-channel transistor (not shown) is formed. Moreover, ion implantation is also selectively performed, thereby forming an n well 220 in the region where a MOS transistor is formed.

Then, the silicon oxide film 204 is stripped away, and a gate insulating film 223 and a gate electrode 224 are formed. Incidentally, the silicon oxide film 218 is etched thinner at the same time the silicon oxide film 204 is removed. In this process, polysilicon having stacked when the gate electrode 224 is formed remains on the sides of the emitter electrode 215a as a polysilicon film 222a.

Next, a p-type dopant is ion-implanted using the gate electrode 224 as a mask, thereby forming a low-concentration region 227 on the substrate 201 in a self-aligning manner. The low-concentration region 227 is used to constitute an LDD structure and may be omitted depending on the MOS transistor performance required. Alternatively, a counter-doped n$^-$ diffusion layer may be employed for this purpose (FIG. 25).

Next, etching is performed by the RIE method after a silicon oxide film has been formed on the entire surface, thereby forming a side wall 226 on the side of the gate electrode 224. At this time, the side wall 226a is also formed on the sides of the emitter electrode 215a.

Thereafter, over-etching is subsequently performed to allow the surface of the substrate 201 of the diffusion layer portion of the MOS transistor to be exposed. At the same time, the surface of the substrate 201 (the base surface) where a side of the base layer 212 of the emitter electrode 215a is formed is exposed. In addition, the silicon oxide film 218 on the upper portion of the emitter electrode 215a is also etched and mostly disappears.

Figure 25:
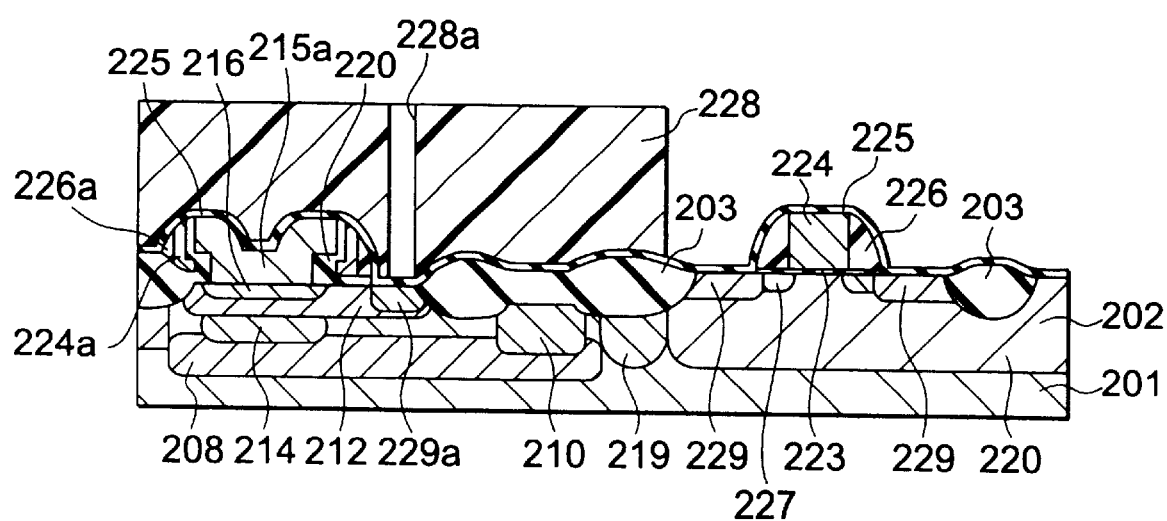

Next, as shown in FIG. 25, after a silicon oxide film 225 has been formed on the entire regions, a photoresist pattern 228 having an opening 228a is formed on a region of the aforementioned base surface. Then, using this as a mask, a p-type dopant is ion-implanted to yield a dose on the order of $1\times10^{15}$ to $1\times10^{16}$ cm$^{-2}$, thereby forming a graft base 229a of the bipolar transistor as well as a source/drain 229.

Subsequently, after the photoresist pattern 228 has been stripped away, an interlayer film is formed using an insulating material, processing is carried out according to a well-known semiconductor device formation method to complete a semiconductor device comprising composite elements. For example, contact holes are formed to provide contacts for the source/drain or other portions, circuits are patterned, and passivation films are formed.

As explained above, according to this embodiment 2, thermal oxidation is performed using the silicon nitride film 205, which has an opening only on the bipolar transistor forming region, as a mask, thereby allowing an oxide film to be formed only upon the bipolar transistor forming region. That is, the silicon oxide film 211 under the emitter electrode 215a can be formed in a desired thickness.

Moreover, a thick silicon oxide film can be simultaneously formed upon the collector layer 210 taking advantage of faster oxidation of the collector layer 210. Taking advantage of this, the base layer 212 can be formed in a self-aligning manner.

Furthermore, the silicon nitride film 205 is not removed until the main portions of the bipolar transistor are completed, so that the element isolation region 203 in the MOS transistor region can be prevented from being reduced in thickness due to the etching for forming the bipolar transistor.

Still furthermore, the MOS transistor is formed after the bipolar transistor has been formed, so that the MOS transistor can be formed without being affected by the heat treatment carried out for forming the bipolar transistor.

As mentioned above, according to the present invention, the bipolar transistor is first formed with the region, where the MOS transistor is to be formed, being protected by means of an oxidation-resistant film. Furthermore, the regions other than the emitter contact of the emitter electrode are isolated from the surface of the semiconductor substrate by means of the silicon oxide film.

Consequently, according to the present invention, a silicon oxide film can be formed only in the region where the bipolar transistor is formed, so that the silicon oxide film 211 under the emitter electrode can be formed in a desired thickness. Furthermore, the oxidation-resistant film (the silicon nitride film 205) is not removed until the main portions of the bipolar transistor are completed, so that the element isolation region can be prevented from being reduced in thickness due to the etching for forming the bipolar transistor. Furthermore, the MOS transistor is formed after the bipolar transistor has been formed, so that the MOS transistor can be formed without being affected by the heat treatment for forming the bipolar transistor. Those described in the foregoing allow for integrating a monolithic bipolar transistor and MOS transistor without degrading the characteristics of the respective elements.

Furthermore, the oxidation-resistant film is formed of silicon nitride, being formed via a silicon oxide film on the semiconductor substrate. This allows the silicon oxide film to protect the surface of the semiconductor substrate when the oxidation-resistant film is removed if such etching condition is employed as to selectively remove silicon nitride relative to silicon oxide.

Still furthermore, a passivation film is so formed as to cover the exposed regions of the sides of and the upper surface of the emitter electrode. This allows for electrically isolating the emitter electrode from the surrounding. Furthermore, the emitter electrode is formed of polysilicon, and the passivation film is formed by thermally oxidizing the exposed surfaces of the emitter electrode. Consequently, the passivation film is formed in a self-aligning manner without depositing a new film, thus allowing for simplifying the process.

What is claimed is:

1. A semiconductor device fabrication method comprising:
    forming first and second regions defined by an element isolation region on a semiconductor substrate;
    forming an oxidation-resistant film on the semiconductor substrate;
    forming a collector layer on said first region;
    removing said oxidation film from said first region;
    forming a silicon oxide film selectively on said first region using said oxidation-resistant film as a mask;
    forming a base layer on said first region;
    forming an emitter layer disposed in the base layer region;
    forming an emitter electrode connected to said emitter layer via a contact hole formed through said silicon oxide film;
    removing said oxidation-resistant film from said second region after having formed a bipolar transistor comprising said collector layer, base layer, and said emitter layer; and
    forming a MOS transistor in said second region after having removed said oxidation-resistant film.

2. The semiconductor device fabrication method according to claim 1, wherein said oxidation-resistant film comprises silicon nitride and is formed on said semiconductor substrate on top of a silicon oxide film.

3. The semiconductor device fabrication method according to claim 1, further comprising forming a passivation film so as to cover exposed regions on sides of and an upper surface of said emitter electrode.

4. The semiconductor device fabrication method according to claim 3, wherein said emitter electrode comprises polysilicon, and said passivation film comprises silicon dioxide.

5. The semiconductor device fabrication method according to claim 2, further comprising: forming a passivation film so as to cover exposed regions on sides of and an upper surface of said emitter electrode.

6. The semiconductor device fabrication method according to claim 5, wherein said emitter electrode comprises polysilicon, and said passivation film is formed by thermally oxidizing exposed surfaces of said emitter electrode.

7. A method of fabricating bipolar devices and MOS devices together on a same semiconductor substrate, comprising:
    forming element isolation regions on a semiconductor substrate to define a first region and a second region;
    forming an oxidation-resistant film on the semiconductor substrate;
    forming a collector layer for at least one bipolar device in said first region;
    removing said oxidation film from said first region;
    forming a base layer, an emitter layer, and an emitter electrode for said at least one bipolar device in said first region;
    removing said oxidation-resistant film from said second region; and
    forming at least one MOS transistor in said second region.

8. The semiconductor device fabrication method according to claim 7, wherein said oxidation-resistant film comprises silicon nitride.

9. The semiconductor device fabrication method according to claim 7, further comprising: forming a passivation film on said emitter electrode.

10. The semiconductor device fabrication method according to claim 9, wherein said passivation film comprises silicon dioxide.

11. A method of fabricating one or more bipolar devices in a first region of a semiconductor substrate together with one or more MOS devices on said substrate, said method comprising:
    forming an oxidation-resistant film on said semiconductor substrate;
    selectively retaining portions of said oxidation-resistant film to protect said second region while said at least one bipolar devices are being fabricated in said first region; and
    removing said oxidation-resistant film from said second region to form said at least one MOS transistors in said second region.

* * * * *